United States Patent [19]

Takasaki et al.

[11] 4,363,868

[45] Dec. 14, 1982

[54] PROCESS OF PRODUCING SEMICONDUCTOR DEVICES BY FORMING A SILICON OXYNITRIDE LAYER BY A PLASMA CVD TECHNIQUE WHICH IS EMPLOYED IN A SELECTIVE OXIDATION PROCESS

[75] Inventors: Kanetake Takasaki, Tokyo; Mamoru Maeda, Tama, both of Japan

[73] Assignee: Fujitsu Limited, Kawasaki, Japan

[21] Appl. No.: 219,494

[22] Filed: Dec. 23, 1980

[30] Foreign Application Priority Data

Dec. 26, 1979 [JP] Japan .................................. 54-170030

[51] Int. Cl.$^3$ ........................................ H01L 21/318
[52] U.S. Cl. ................................... 430/314; 156/653; 156/657; 427/39; 427/93; 427/94; 427/95; 430/316; 430/317
[58] Field of Search .................. 427/38, 39, 93–95; 430/314, 316, 317; 156/653, 657

[56] References Cited

U.S. PATENT DOCUMENTS

| | | | |
|---|---|---|---|
| 3,422,321 | 1/1969 | Tombs | 427/95 |
| 3,655,438 | 4/1972 | Sterling et al. | 427/39 |
| 3,913,211 | 10/1975 | Seeds et al. | 427/93 |
| 4,282,270 | 8/1981 | Nozaki et al. | 427/94 |
| 4,289,797 | 9/1981 | Akselrad | 427/39 |

FOREIGN PATENT DOCUMENTS 50-40116 12/1975 Japan .................................. 427/39

OTHER PUBLICATIONS

Morosanu et al., "Thin Film Preparation by Plasma and Low Pressure CVD in a Horizontal Reactor", Vacuum, vol. 31, No. 7, pp. 309–313, 1981.

Primary Examiner—John D. Smith
Attorney, Agent, or Firm—Staas & Halsey

[57] ABSTRACT

A selective oxidation process for producing a semiconductor device comprises the step of depositing a silicon oxynitride layer directly on a silicon substrate by a plasma chemical vapor deposition method. After a selective oxidation of the silicon substrate, the silicon oxynitride layer is removed.

4 Claims, 9 Drawing Figures

PROCESS OF PRODUCING SEMICONDUCTOR DEVICES BY FORMING A SILICON OXYNITRIDE LAYER BY A PLASMA CVD TECHNIQUE WHICH IS EMPLOYED IN A SELECTIVE OXIDATION PROCESS

BACKGROUND OF THE INVENTION

1. Field of the Invention

The present invention relates to a process for producing a semiconductor device, more particularly to an improved selective oxidation process.

2. Description of the Prior Art

When a semiconductor device having a relatively thick oxide layer (e.g. a field oxide layer isolating a semiconductor element from other semiconductor elements) is produced, a selective oxidation process is usually utilized. Generally, the selective oxidation process comprises the steps of forming a silicon oxide layer on a semiconductor substrate, forming a silicon nitride layer on the oxide layer, selectively etching the nitride and oxide layers to expose a portion of the semiconductor substrate, and oxidizing the exposed portion of the semiconductor substrate. The above-mentioned selective oxidation process is explained in detail with reference to FIGS. 1A, 1B and 1C.

A silicon dioxide ($SiO_2$) layer 2 (FIG. 1A) having a thickness of approximately 50 nm (i.e. 500 angstroms) is formed on a silicon (Si) substrate (i.e. a single crystalline silicon wafer) 1 by a conventional thermal oxidation method or chemical vapor deposition (CVD) method. Then, a silicon nitride ($Si_3N_4$) layer 3 having a thickness of approximately 100 nm is deposited on the silicon oxide layer 2 by a conventional CVD method, as illustrated in FIG. 1A.

Next, the silicon nitride layer 3 and silicon dioxide layer 2 are selectively etched by a photoetching method, as illustrated in FIG. 1B. Namely, a photoresist layer (not illustrated) applied on the silicon nitride layer 3, is exposed and is developed to form a patterned resist mask. The unmasked portion of the silicon nitride layer is etched by a hot phosphoric acid solution and then the exposed portion of the silicon dioxide layer 2 is etched by a hydrofluoric acid solution to expose the underlying portion of the silicon substrate 1.

The silicon substrate 1 with the patterned silicon dioxide layer 2 and silicon nitride layer 3 then is subjected to a conventional thermal oxidation treatment to convert the exposed portion of the silicon substrate 1 into a relatively thick silicon dioxide layer 4, i.e. a field oxide layer or an isolation oxide layer, as illustrated in FIG. 1C. Simultaneously, an upper portion of the silicon nitride layer 3 is changed into a silicon dioxide layer 5 having a thickness of approximately 50 nm during the thermal oxidation treatment.

However, the above-mentioned selective oxidation process has the following disadvantages (1) and (2).

(1) If the silicon nitride layer 3 is directly deposited on the silicon substrate 1 without the silicon dioxide layer 2, when the substrate 1 is heated for the thermal oxidation treatment, internal stress (i.e. thermal stress) occurs at the boundary of the silicon nitride layer 3 and the silicon substrate 1, whereby cracks in the silicon nitride layer 3 and/or crystal faults in the silicon substrate are generated. As a result, the electrical properties of a semiconductor element to be formed are lowered. Therefore, in order to prevent the internal stress from occurring, it is necessary to provide the silicon dioxide layer 2 between the silicon substrate 1 and the silicon nitride layer 3. However, the silicon dioxide layer 2 promotes the formation of a so-called bird's beak, as illustrated in FIG. 1C. The bird's beak is formed by oxidizing a portion of the silicon substrate 1 which lies under the end portion of the silicon dioxide layer 2 so as to convert silicon into silicon dioxide during the thermal oxidation treatment. The bird's beak can reduce the dimensional precision of a semiconductor element to be formed in the region of the substrate 1 masked by the layers 2, 3 and 5 and bounded by the field oxide 4, lower the electrical properties of that semiconductor element.

(2) In order to remove the successive silicon dioxide layer 2, the silicon nitride layer 3, and the silicon dioxide layer 5 to expose the underlying portion of the silicon substrate 1 wherein a semiconductor element (e.g. a bipolar transistor, a metal oxide semiconductor field effect transistor (MOS FET) and the like) or a passive element (e.g. a diffused resistor) will be formed in the succeeding steps of the producing process for a semiconductor device, it is necessary to perform three successive steps. Namely, first the silicon dioxide layer 5 is etched by a hydrofluoric acid solution, secondly the silicon nitride layer 3 is etched by a hot phosphoric acid solution and lastly the silicon dioxide layer 2 is etched by a hydrofluoric acid solution. The above described three etching steps are not preferable from the viewpoints of production cost and production time.

It has been tried to employ a silicon oxynitride (SiON) layer, which is formed by a conventional chemical vapor deposition (CVD) method at a deposition temperature in the range of from 850° to 1050° C., as a barrier to oxidation. The silicon oxynitride layer is preferable to the silicon nitride ($Si_3N_4$) such as layer 3 in FIG. 1C. However, etchrate of the silicon dioxide is larger than that of silicon oxynitride, so that a field oxide layer as provided by the silicon dioxide layer 4 in FIG. 1C is remarkably etched during removal of the silicon oxynitride layer by etching.

SUMMARY OF THE INVENTION

An object of the present invention is to provide an improved process for producing a semiconductor device which avoids the above-mentioned disadvantages of prior techniques.

Another object of the present invention is provide an improved selective oxidation process.

The above and other objects of the present invention are achieved by providing a process for producing a semiconductor device comprising the steps of forming a silicon oxynitride (SiON) layer on a semiconductor substrate by a plasma chemical vapor deposition method, instead of both a silicon dioxide ($SiO_2$) layer and a silicon nitride ($Si_3N_4$) layer which are formed in a conventional selective oxidation process. The composition of the silicon oxynitride, i.e., the symbols "l", "m" and "n" in the chemical formula ($Si_lO_mN_n$) of silicon oxynitride can vary in accordance with a combination of monosilane ($SiH_4$) gas, nitrous oxide ($N_2O$) gas and ammonia ($NH_3$) gas which are fed into a plasma CVD apparatus. In a case where the silicon oxynitride layer is deposited directly on a silicon substrate, when the substrate is heated for a thermal oxidation treatment, slight internal stress occurs at the boundary of the silicon oxynitride layer and the substrate. Such slight internal stress does not bring about the above-mentioned disadvantages, i.e., cracks in the silicon oxynitride layer and/or crystal faults in the silicon substrate, as occur when silicon nitride is deposited directly on the silicon substrate. Moreover, when the silicon substrate with the silicon oxynitride layer which is patterned by a conventional photoetching process is subjected to a thermal oxidation treatment to form a relatively thick silicon dioxide layer (e.g. a field oxide layer), a so-called bird's beak smaller than that formed in the prior art is formed. The bird's beak formed when employing the process of the present invention is one-third to one-half of that formed when employing the conventional selective oxidation process. Furthermore, it is possible to easily etch the silicon oxynitride layer by a hydrofluoric acid solution which is used for etching a silicon dioxide layer. It is preferable to form the silicon oxynitride layer having the thickness of from 100 to 300 nm. When a thickness of the silicon oxynitride layer is below 100 nm, the silicon oxynitride layer does not serve adequately as a barrier to oxidation during the thermal oxidation treatment. If the thickness of the silicon oxynitride layer is above 300 nm, cracks possibly will be formed in the oxynitride layer during the thermal oxidation treatment.

The present invention will become more apparent from the detailed description of the invention set forth below with reference to the accompanying drawings.

DETAILED DESCRIPTION OF THE INVENTION

Figure 1A:
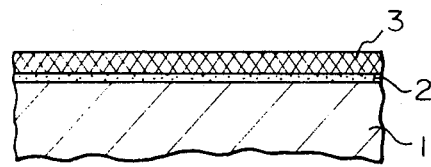
FIGS. 1A, 1B and 1C are sectional views of a portion of a semiconductor device in various stages of production in accordance with the prior art.
Figure 1B:
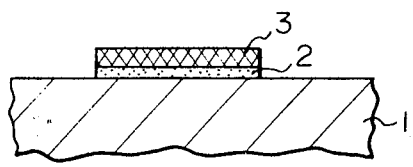
Figure 1C:
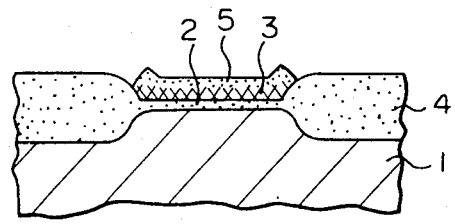
Figure 2:
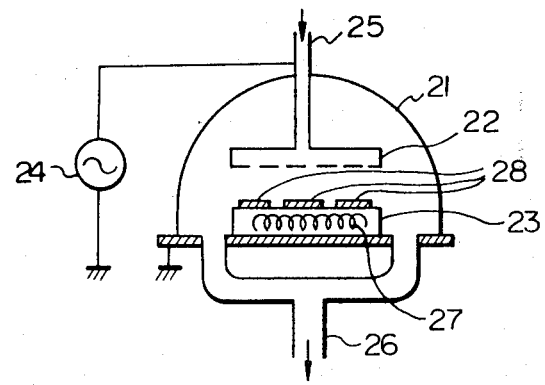
FIG. 2 is schematic sectional view of a plasma chemical vapor deposition apparatus.

Referring to FIG. 2, the formation of a silicon oxynitride layer by a plasma chemical vapor deposition (CVD) method will be explained. The plasma CVD apparatus (FIG. 2) comprises a bell jar type reactive chamber 21, electrodes 22 and 23, a power source 24 connected with the electrodes 22 and 23, an inlet pipe 25, an outlet pipe 26 and a heater 27. In operation, silicon substrates 28 are set on the lower electrode 23 and then the reactive chamber 21 is evacuated until the pressure therein reaches $5\times10^{-3}$ Torr. A gaseous mixture consisting of monosilane ($SiH_4$), nitrous oxide ($N_2O$) and ammonia ($NH_3$) is introduced into the reactive chamber 21 through the inlet pipe 25. Maintaining a gas pressure of the gaseous mixture within the range of from 0.3 to 2.0 Torr, the gaseous mixture flows from the inlet pipe 25 through openings in the upper electrode 22 into the chamber and is exhausted through the outlet pipe 26. The temperature of the silicon substrates 28 set on the lower electrode 23 is maintained within the range of from 250° to 450° C. by means of the heater 27. An output of the power source 24 (frequency: 13.56 MHz, power: 0.05~1 W/cm$^2$) is applied between the electrodes 22 and 23. Thus, the gaseous mixture in a plasma state reacts above the silicon substrates 28 to deposit a silicon oxynitride (SiON) layer onto the silicon substrates 2.

Figure 3:
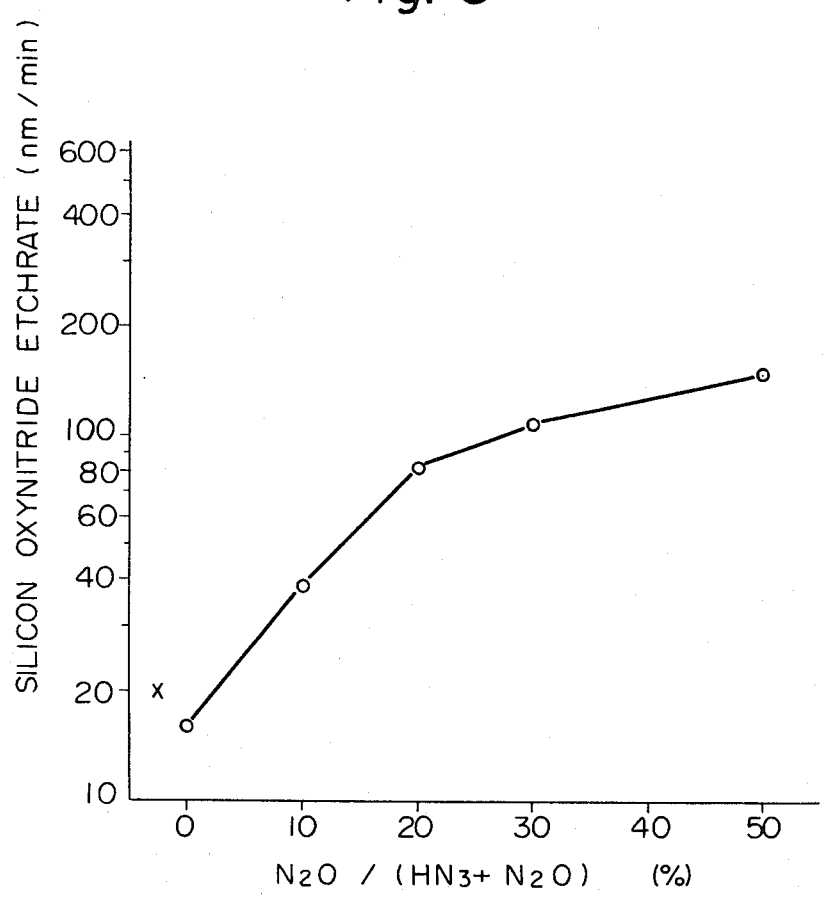
FIG. 3 is a diagram showing a relationship between the silicon oxynitride etchrate with a diluted hydrofluoric acid solution and gas ratio of $N_2O$ to $(NH_3+N_2O)$.

The etchrate of the silicon oxynitride layer deposited in the above mentioned manner is shown in FIG. 3. The solid line in FIG. 3 has been determined on the basis of experiments carried out under the following conditions.

Depositing conditions for the silicon oxynitride layers were as follows:

Used gases: $SiH_4$, $NH_3$ and $N_2O$
Gas pressure: 1 Torr
Ratio of $(NH_3+N_2O)$ to $SiH_4$: 10 to 1 (constant)
Percentage of $N_2O$ to $(NH_3+N_2O)$: 0, 10, 20, 30 and 50%
Temperature of silicon substrate: 400° C.
RF Power: 50 W The deposited silicon oxynitride layers were etched by a diluted hydrofluoric acid solution (1.25% HF) to obtain the etchrate of the layers. The etchrate of a silicon dioxide layer with the same etching solution is approximately 20 nm/min and is indicated by the symbol "X" in FIG. 3. Furthermore, in a case where the oxidation rate of a silicon oxynitride layer formed in accordance with the present invention is nearly equal to that of a silicon oxynitride layer formed by a conventional CVD method at 850° C., the etchrate of the former oxynitride layer is 40 nm/min, while that of the latter oxynitride layer is 10 nm/min with the diluted hydrofluoric acid solution (1.25% HF).

A preferred embodiment of the process of the present invention is now explained with reference to FIGS. 4A through 4D.

Figure 4A:
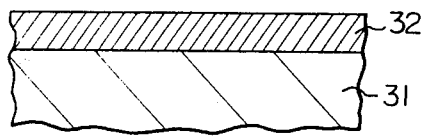
FIGS. 4A through 4D are sectional views of a portion of a semiconductor device in various stages of production in accordance with the present invention.

On a major surface of single crystalline silicon substrate 31, a silicon oxynitride layer 32 having a thickness of approximately 200 nm is deposited by the above-mentioned plasma chemical vapor deposition treatment, as illustrated in FIG. 4A. The depositing conditions are the same as those of the above-mentioned experiments except that the temperature of the substrate is 350° C. In this case, the percentage of $N_2O$ relative to $(NH_3+N_2O)$ is 20%. Since the etchrate of silicon oxynitride is higher than that of silicon nitride, the silicon oxynitride layer which is deposited is relatively thick as compared with a silicon nitride layer used in a conventional selective oxidation process.

Figure 4B:
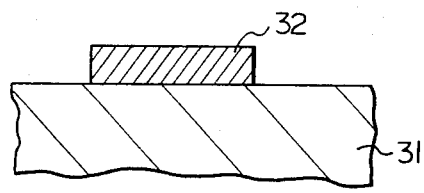

Then, the deposited silicon oxynitride layer 32 is selectively removed by a conventional photoetching method to expose a portion of the silicon substrate 31, as illustrated in FIG. 4B. A diluted hydrofluoric acid solution (1.25% HF) is used as an etchant for silicon oxynitride.

Figure 4C:
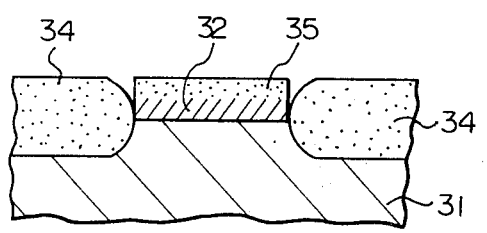

The silicon substrate 31 with the remaining silicon oxynitride layer 32 is subjected to a thermal oxidation treatment at a temperature of 1,000° C. or more to convert the exposed portion of the silicon substrate 31 into a silicon dioxide layer 34 having a thickness of 1.2 μm, as illustrated in FIG. 4C. In this case, the upper portion of the silicon oxynitride layer 32 is simultaneously oxidized to change it into a silicon dioxide layer 35 having a thickness of approximately 100 nm.

Figure 4D:
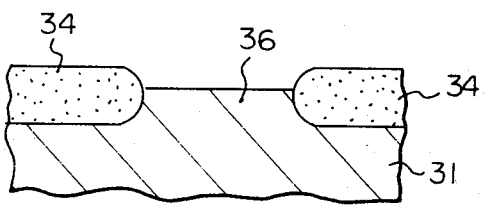

Then, the resulting silicon substrate of FIG. 4C is subjected to an etching treatment using a diluted hydrofluoric acid solution (1.25% HF) to remove the silicon oxynitride layer 32 and the silicon dioxide layer 35 formed thereon, as illustrated in FIG. 4D. In this case, since the upper portion of the thick silicon dioxide layer 34 is simultaneously etched, the thickness of the resulting layer 34 in FIG. 4D is decreased to approximately 1 μm. Namely, since the etchrate of the silicon oxynitride is larger than that of the silicon dioxide, the silicon oxynitride layer 35 of FIG. 3C can be entirely removed and still a relatively thick silicon dioxide layer 34 in FIG. 4D remains. The silicon dioxide layer 34 may be used as an isolation oxide layer for dielectric isolation in a semiconductor device. As a result of the etching treatment, a portion 36 of the silicon substrate 31 is exposed. A semiconductor element or a passive element then is formed in the exposed portion 36 in accordance with a suitable forming process.

It will be obvious that the present invention is not restricted to the embodiment described and that modifications are possible for a person with ordinary skill in the art without departing from the scope of this invention. For example, after impurity introduced portions of a silicon substrate are formed by an ion implantation method, a selective oxidation process is carried out in accordance with the present invention.

We claim:

1. A process for producing a semiconductor device comprising the steps of:
   forming a silicon oxynitride layer on a semiconductor substrate by a plasma chemical vapor deposition method;
   selectively etching said silicon oxynitride layer to expose a portion of said semiconductor substrate;
   oxidizing said portion of said semiconductor substrate to form an oxide layer, and
   removing the remaining silicon oxynitride layer by an etchant comprising a solution of hydrofluoric acid.

2. The process recited in claim 1, wherein said plasma chemical vapor deposition method employs monosilane gas, ammonia gas and nitrous oxide gas.

3. The process recited in claim 1, wherein said selectively etching step comprises photoetching said silicon oxynitride layer.

4. The process recited in claim 1, wherein said silicon oxynitride layer has a thickness of from 100 to 300 nm.

* * * * *

UNITED STATES PATENT AND TRADEMARK OFFICE
CERTIFICATE OF CORRECTION

PATENT NO. : 4,363,868
DATED : December 14, 1982
INVENTOR(S) : Takasaki et al.

It is certified that error appears in the above-identified patent and that said Letters Patent is hereby corrected as shown below:

Front page, first column, [54], "PROCESS OF PRODUCING SEMICONDUCTOR DEVICES BY FORMING A SILICON OXYNITRIDE LAYER BY A PLASMA CVD TECHNIQUE WHICH IS EMPLOYED IN A SELECTIVE OXIDATION PROCESS" should be --PROCESS OF PRODUCING SEMICONDUCTOR DEVICES--;

Col. 2, line 60, after "oxynitride" insert --,--;

Col. 3, line 37, after "($NH_3+N_2O$)" insert --;--;

line 38, delete ";";

line 47, after "will" insert --now--;

line 61, after "chamber" insert --21--;

Signed and Sealed this

Twenty-fourth Day of May 1983

[SEAL]

Attest:

DONALD J. QUIGG

Attesting Officer  Acting Commissioner of Patents and Trademarks